United States Patent
Groves et al.

(10) Patent No.: US 6,936,764 B2
(45) Date of Patent: Aug. 30, 2005

(54) THREE DIMENSIONAL DYNAMICALLY SHIELDED HIGH-Q BEOL METALLIZATION

(75) Inventors: Robert A. Groves, Highland, NY (US); Jae-Eun Park, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 66 days.

(21) Appl. No.: 10/604,706

(22) Filed: Aug. 12, 2003

(65) Prior Publication Data

US 2005/0034885 A1 Feb. 17, 2005

(51) Int. Cl.[7] .............................................. H05K 9/00
(52) U.S. Cl. ................................ 174/35 CE; 174/35 R
(58) Field of Search ........................ 174/35 R, 35 CE; 361/816, 818

(56) References Cited

U.S. PATENT DOCUMENTS

| | | |
|---|---|---|
| 5,461,353 A | 10/1995 | Eberhardt |
| 5,559,360 A | 9/1996 | Chiu et al. |
| 5,760,456 A | 6/1998 | Grzegorek et al. |
| 6,437,409 B2 | 8/2002 | Fujii |
| 6,452,249 B1 | 9/2002 | Maeda et al. |
| 6,720,245 B2 * | 4/2004 | Stucchi et al. .............. 438/614 |
| 2001/0013626 A1 | 8/2001 | Fujii |
| 2001/0045616 A1 | 11/2001 | Yoshitomi |
| 2002/0109204 A1 | 8/2002 | Acosta et al. |
| 2002/0130739 A1 | 9/2002 | Cotton |
| 2002/0158306 A1 | 10/2002 | Niitsu |

\* cited by examiner

Primary Examiner—Hung V. Ngo
(74) Attorney, Agent, or Firm—Scully, Scott, Murphy & Presser; Joseph P. Abate, Esq.

(57) ABSTRACT

Three dimensional dynamically shielded high quality factor (Q) BEOL metal elements, such as inductor elements, are disclosed. Three dimensional shielding structures for the BEOL elements reduce or eliminate parasitic substrate capacitive coupling between the BEOL element and the conductive substrate, and parasitic shunt capacitance coupling between different adjacent shunt sections of the BEOL element. The reduction or elimination of the parasitic capacitive components provides high Q BEOL metal elements such as inductor elements. The three dimensional shield structure includes a lower shield surface having a width greater than the width of the BEOL element, and opposed side shield surfaces which extend upwardly from opposite side edges of the lower shield surface, such that the three dimensional shield element forms a U shaped shield around the BEOL element. The three dimensional shield element is dynamically driven to the same electrical potential as the BEOL element, to substantially eliminate the metal element's parasitic capacitances.

31 Claims, 1 Drawing Sheet

THREE DIMENSIONAL DYNAMICALLY SHIELDED HIGH-Q BEOL METALLIZATION

BACKGROUND OF INVENTION

The present invention relates generally to the realization of RF passive elements and interconnect metallization with very low parasitic capacitance to an underlying conductive substrate and adjacent metallization through the use of conductive, three dimensional, dynamic shielding. More particularly, the subject invention pertains to three dimensional, dynamically shielded metal elements such as inductors, MIM (metal-insulator-metal) capacitors, resistors, wirebond pads, and stable bias lines constructed in the interconnect metallization layers (Back End Of Line, BEOL) of a monolithic, integrated circuit. This three dimensional shielding of the BEOL elements (inductors, capacitors, resistors, etc.) reduces or eliminates the parasitic capacitive coupling between the element and the conductive substrate. Additionally, parasitic fringe capacitance coupling between the specific BEOL element and adjacent areas of metallization is reduced or eliminated, generally increasing the elements self-resonance frequency and reducing crosstalk between BEOL elements.

One area of particular interest for BEOL passive elements centers on the improvement of inductor elements. Prior art implementations for BEOL inductor elements have utilized a buffered drive of adjacent spiral inductive elements to achieve a higher quality factor (Q), and have required complicated processing or many additional accessory functional elements, such as a variable attenuator and a variable phase shifter. These prior art implementations of shielded inductors have attempted to achieve a higher Q by increasing the magnetic flux coupling of the inductor (Yeung, et. al., "Design Considerations for extremely High Q Integrated Inductors and Their Application in CMOS RF Power Amplifier", IEEE Proceedings, RAWCON, 1998).

Another area of particular interest pertaining to BEOL elements concentrates on the reduction of parasitic capacitance between interconnect elements and an underlying conductive substrate or adjacent metallization. Prior art implementations have utilized a planar shield, underneath the interconnect, driven by a buffer to minimize capacitive coupling to a conductive substrate (U.S. Pat. No. 5,151,775, Hadwin).

SUMMARY OF INVENTION

Accordingly, it is a primary object of the present invention to provide three dimensional, dynamically shielded, high Q BEOL metal elements. Conductive, three dimensional shielding structures for BEOL elements reduce or eliminate, parasitic capacitive coupling between the BEOL element and the conductive substrate, and parasitic shunt capacitance between different adjacent shunt sections of the BEOL element. The three dimensional nature of the proposed shielding structure substantially improves on the prior art implementations that make use of substantially planar shields that have reduced effects on fringing fields in general.

The conductive, three dimensional shield structure is dynamically driven to the same electrical potential as the BEOL element itself, to substantially eliminate the element's parasitic capacitances.

The reduction or elimination of the parasitic capacitive components provides high Q, low loss BEOL elements and components. Inductor elements can achieve at least a 100% increase in peak quality factor Q using the three dimensional shield structures or elements of the present invention.

In one disclosed embodiment, the BEOL element comprises a two dimensional spiral inductor element with a series of linear conductor segments separated by angular bends, which can be substantially 90 degree angular bends or other greater or lesser degree angular bends, such that the series of linear conductor segments and angular bends enable the conductor element to spiral within itself and terminate in an inner end near the center of the convoluted spiral conductor element. The conductive, three dimensional shield structure or element is formed below and around the convoluted conductor element, and follows the convoluted shape of the conductor element. The three dimensional shield structure or element includes a lower shield surface having a width greater than the width of the inductor element, and opposed side shield surfaces which extend upwardly from opposite side edges of the lower shield surface and are spaced from opposite sides of the BEOL upper inductor element, such that the three dimensional shield element forms a U shaped shield which wraps around and shields the inductor. The opposed side shield surfaces can be fabricated from standard interlayer metal via arrays or bars in addition to the interconnect layers, providing a substantially solid wall of metal (minimally spaced vias will provide a "substantially solid wall" if they are used instead of via bars).

Although the disclosed embodiment comprises a BEOL spiral inductor element, the present invention has broader applicability to BEOL metallization in general and BEOL metal elements such as metal interconnects, MIM (metal, insulator, metal) capacitors, resistors, wire bond pads, stable bias lines for memory, etc.

BRIEF DESCRIPTION OF DRAWINGS

The foregoing objects and advantages of the present invention for three dimensional, dynamically shielded, high-Q BEOL metallization may be more readily understood by one skilled in the art with reference being made to the following detailed description of several embodiments thereof, taken in conjunction with the accompanying drawings wherein like elements are designated by identical reference numerals throughout the several views, and in which.

DETAILED DESCRIPTION

Figure 1:
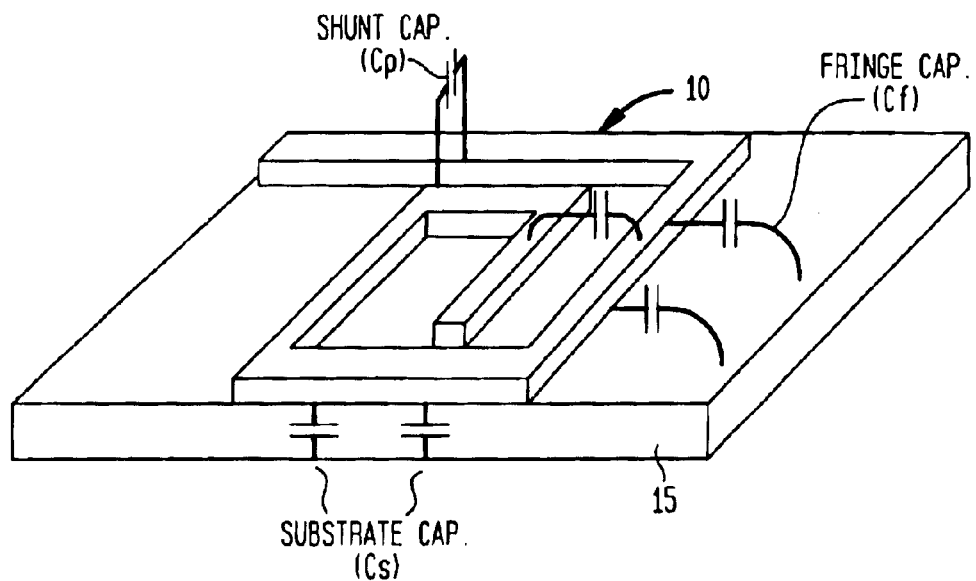
FIG. 1 illustrates a conventional prior art spiral type of upper inductor element realized in the BEOL (Back End Of Line) processing of monolithic integrated circuits.

FIG. 1 illustrates a conventional prior art spiral type of inductor element realized in the BEOL (Back End Of Line) processing of monolithic integrated circuits. Such conventional prior art spiral inductor elements suffer from excessive power losses due to: 1) parasitic substrate capacitive coupling Cs between the inductor 10 and the conductive substrate 15; 2) parasitic fringe capacitance coupling Cf between the inductor 10 and the conductive substrate 15; and 3) parasitic shunt capacitance coupling Cp between different adjacent shunt sections of the inductor 10.

These excessive power losses make it difficult to achieve System On Chip (SOC) applications due to the relatively low Q of the integrated passive inductors.

Figure 2:
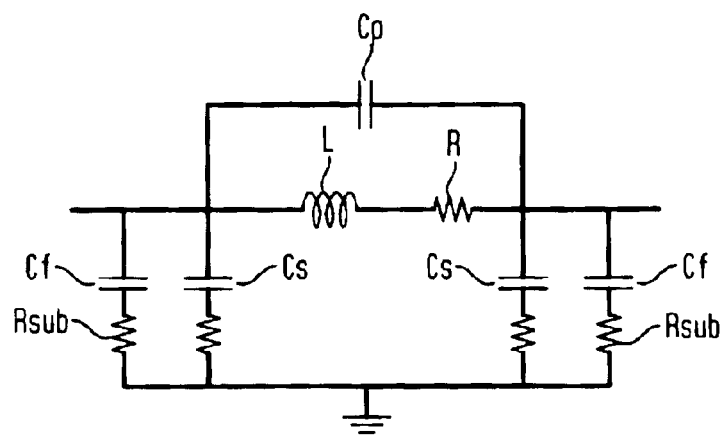
FIG. 2 illustrates an equivalent circuit for the conventional prior art inductor element of FIG. 1.

FIG. 2 illustrates an equivalent circuit for a conventional prior art spiral type of inductor element. The inductor is illustrated as having an equivalent inductive component L and a resistive component R, with a parasitic substrate capacitive coupling Cs illustrated at each end of the equivalent inductance L and resistance R which is coupled through a resistance Rsub to ground. The inductor is also illustrated with a parasitic fringe capacitance Cf at each end of the equivalent inductance L and resistance R coupled through a resistance Rsub to ground, and a parasitic shunt capacitance Cp coupling each end of the equivalent inductive component L and resistive component R.

The present invention provides conductive, three dimensional shielding structures for BEOL elements such as inductors to reduce or eliminate, the parasitic substrate capacitive coupling Cs between the BEOL element and the conductive substrate, the parasitic fringe capacitance coupling Cf between the BEOL element and substrate, and the parasitic shunt capacitance coupling Cp between different adjacent shunt sections of the BEOL element. The reduction or elimination of these parasitic capacitive components Cs, Cf, and Cp provides high Q BEOL elements.

In a disclosed embodiment, the BEOL element comprises a two dimensional convoluted spiral inductor element with a series of linear conductor segments separated by angular bends, such as substantially 90 degree bends, although other bend angles are possible in alternative embodiments, such that the series of linear conductor segments and angular bends enable the conductor element to spiral within itself and terminate in an inner end near the center of the convoluted conductor element.

The conductive, three dimensional shield element is formed below and around the convoluted conductor element, and follows the convoluted shape of the conductor element. The three dimensional shield element includes a lower shield surface having a width greater than the width of the inductor element, and opposed side shield surfaces which extend upwardly from opposite side edges of the lower shield surface and are spaced from opposite sides of the inductor element, such that the three dimensional shield element forms a U shaped shield which wraps around the inductor element. The opposed side shield surfaces can be fabricated from standard interlayer metal via arrays or bars in addition to the interconnect layers, providing a substantially solid wall of metal (minimally spaced vias will provide a "substantially solid wall" if they are used instead of via bars).

The conductive, three dimensional shield element is dynamically driven to the same electrical potential as the inductor element itself, to substantially eliminate the inductor element's parasitic capacitances.

This results in very high Q inductor components. The BEOL upper inductor elements can achieve at least a 100% increase in peak Q using the three dimensional shield elements of the present invention.

Figure 3:
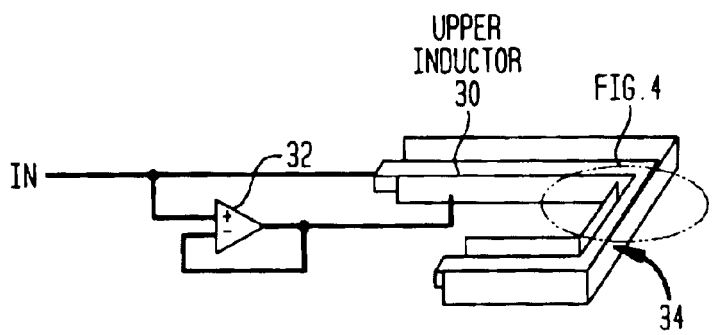
FIGS. 3 and 4 are respectively a front perspective view and a vertical cross sectional view of an embodiment of the present invention wherein a conventional inductor element is fabricated with an additional buffer element and a three dimensional bottom shield structure or element.
Figure 4:
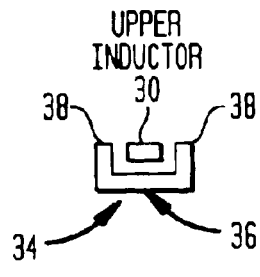

FIGS. 3 and 4 are respectively a front perspective view and a vertical cross sectional view, taken through cut out oval 4, of an embodiment of the present invention wherein a conventional BEOL upper metal element 30 is fabricated with an additional buffer element 32 and a three dimensional bottom shield element 34.

In the disclosed embodiment, the BEOL upper metal element 30 comprises a two dimensional convoluted conductor element, realized as an inductor, with a series of linear conductor segments separated by substantially 90 degree bends, although other angular bends are possible in alternative embodiments, such that the series of linear conductor segments and angular bends enable the conductor element to convolute within itself and terminate in an inner end near the center of the convoluted conductor element 30.

Although the disclosed embodiment illustrates a spiral inductor element, in alternative embodiments of the present invention, the BEOL element 30 could comprise alternative BEOL metal elements in general, such as metal interconnects, MIM (metal, insulator, metal) capacitors, resistors, wirebond pads, stable bias lines for memory, etc., and the principle of operation would be the same.

The conductive three dimensional shield element 34 is formed by conventional BEOL processes below and follows the convoluted shape of the conductor element 30. The three dimensional shield element 34 includes a lower shield surface 36 having a width greater than the width of the inductor element 30 and opposed side shield surfaces 38 which extend upwardly from opposite side edges of the lower shield surface 36 and are spaced from opposite sides of the inductor element 30, such that the three dimensional shield element 34 forms a U shaped shield which wraps around the inductor element. In one embodiment, the opposed side shield surfaces 38 can be fabricated with the same fabrication technology used to fabricate vias. These vias can be in the form of many minimally spaced square vias or one long bar via.

Pursuant to the present invention, a buffered electrical signal is applied by the additional buffer element 32 to the three dimensional shield element 34 that is in phase with the electrical signal applied to the inductor element 30. The buffer circuit 32 can be easily constructed using any circuit which provides a high input impedance and unity gain, such as a simple emitter follower or cource follower circuit.

Since the electrical signal applied to the three dimensional shield element 32 is synchronized (in phase) with the electrical signal applied to the inductor element 30, any parasitic capacitive coupling between the inductor element 30 and the conductive substrate or adjacent metallization is electronically eliminated. Since the three dimensional bottom shield element 32 wraps around the upper inductor element layers, the parasitic capacitances, such as capacitance Cp, Cs and Cf that a conventional prior art inductor element inherently has (as shown in FIG. 1), are electrically removed.

Since any capacitive path to the resistance of the substrate Rsub is eliminated, there is no power loss in the substrate.

Therefore a higher Q, at least 100% higher, can be achieved compared to conventional prior art inductor elements.

High Q inductors can provide increased selectively for band pass filters (BPFs), low phase noise in voltage controlled oscillators (VCOs), a low noise figure for low noise amplifiers (LNAs), and significant improvements in a large number of different diverse electrical circuits. Additionally, the reduction or elimination of BEOL element to substrate capacitance for any general passive BEOL structure (i.e. interconnect, MIM capacitors, resistors, wirebond pads, stable bias lines, etc.) provides improved high frequency performance.

The technical approach of the present invention improves and enhances the quality factor Q of BEOL upper metal elements by decoupling the BEOL elements from their surroundings through the addition of a few additional active components that are readily available and can be easily fabricated in an integrated CMOS (complementary metal oxide semiconductor) process, BiCMOS process, or other semiconductor process capable of creating amplifier elements. Also the present invention has a high potential to have increased magnetic flux coupling depending on the terminating condition of the three dimensional shield element.

Although the disclosed embodiment illustrates a spiral inductor element, in alternative embodiments the present invention has broader applicability to BEOL metallization and metal elements in general, such as metal interconnects, MIM (metal, insulator, metal) capacitors, wirebond pads, stable bias lines for memory, etc.

The present invention provides three dimensional, dynamically shielded, high Q BEOL elements such as inductor elements. Conductive, three dimensional shielding structures for the BEOL elements reduce or eliminate, parasitic substrate capacitive coupling between the BEOL element and the conductive substrate, and parasitic shunt capacitance coupling between different adjacent shunt sections of the BEOL element.

The conductive, three dimensional shield structure or element is dynamically driven to the same electrical potential as the BEOL element itself, to substantially eliminate the BEOL element's parasitic capacitances.

While several embodiments and variation of the present invention for a three dimensional dynamically shielded high-Q BEOL metallization are described in detail herein, it should be apparent that the disclosure and teachings of the present invention will suggest many alternative designs to those skilled in the art.

What is claimed is:

1. A three dimensional, dynamically shielded, high Q BEOL (back end of line) metal element comprising:
   a BEOL metal element;
   a conductive three dimensional shield element which wraps around the BEOL metal element to substantially reduce or eliminate parasitic capacitive coupling between the BEOL metal element and a conductive substrate, and parasitic shunt capacitance coupling between different adjacent shunt sections of the BEOL metal element, wherein the three dimensional shield element is dynamically driven to the same electrical potential as the BEOL metal element, to substantially reduce or eliminate the parasitic capacitances of the BEOL metal element.

2. The BEOL metal element of claim 1, wherein the three dimensional shield element is dynamically driven to the same electrical potential as the BEOL metal element by a high input impedance unity gain circuit fabricated with the BEOL metal element.

3. The BEOL metal element of claim 2, wherein the high input impedance unity gain circuit comprises an emitter follower or source follower circuit.

4. The BEOL metal element of claim 1, wherein the three dimensional shield element includes a lower shield surface having a width greater than the width of the BEOL metal element, and opposed side shield surfaces which extend upwardly from opposite side edges of the lower shield surface and are spaced from opposite sides of the BEOL metal element, such that the three dimensional shield element forms a U shaped shield which wraps around the BEOL metal element.

5. The BEOL metal element of claim 4, wherein the opposed side shield surfaces are fabricated using minimally spaced square vias.

6. The BEOL metal element of claim 4, wherein the opposed side shield surfaces are fabricated using long bar vias.

7. The BEOL metal element of claim 1, wherein the BEOL metal element comprises a BEOL MIM (metal-insulator-metal) capacitor.

8. The BEOL metal element of claim 7, wherein the three dimensional shield element is dynamically driven to the same electrical potential as the BEOL metal element, to substantially reduce or eliminate the parasitic capacitances of the BEOL metal element.

9. The BEOL metal element of claim 8, wherein the three dimensional shield element includes a lower shield surface having a width greater than the width of the BEOL metal element, and opposed side shield surfaces which extend upwardly from opposite side edges of the lower shield surface and are spaced from opposite sides of the BEOL metal element, such that the three dimensional shield element forms a U shaped shield which wraps around the BEOL metal element.

10. The BEOL metal element of claim 9, wherein the opposed side shield surfaces are fabricated using minimally spaced square vias.

11. The BEOL metal element of claim 9, wherein the opposed side shield surfaces are fabricated using long bar vias.

12. The BEOL metal element of claim 1, wherein the BEOL metal element comprises a BEOL wire bond pad.

13. The BEOL metal element of claim 12, wherein the three dimensional shield element is dynamically driven to the same electrical potential as the BEOL metal element, to substantially reduce or eliminate the parasitic capacitances of the BEOL metal element.

14. The BEOL metal element of claim 13, wherein the three dimensional shield element includes a lower shield surface having a width greater than the width of the BEOL metal element, and opposed side shield surfaces which extend upwardly from opposite side edges of the lower shield surface and are spaced from opposite sides of the BEOL metal element, such that the three dimensional shield element forms a U shaped shield which wraps around the BEOL metal element.

15. The BEOL metal element of claim 14, wherein the opposed side shield surfaces are fabricated using minimally spaced square vias.

16. The BEOL metal element of claim 14, wherein the opposed side shield surfaces are fabricated using long bar vias.

17. The BEOL metal element of claim 1, wherein the BEOL metal element comprises a BEOL stable bias line for a memory.

18. The BEOL metal element of claim 17, wherein the three dimensional shield element is dynamically driven to the same electrical potential as the BEOL metal element, to substantially reduce or eliminate the parasitic capacitances of the BEOL metal element.

19. The BEOL metal element of claim 18, wherein the three dimensional shield element includes a lower shield surface having a width greater than the width of the BEOL metal element, and opposed side shield surfaces which extend upwardly from opposite side edges of the lower shield surface and are spaced from opposite sides of the BEOL metal element, such that the three dimensional shield element forms a U shaped shield which wraps around the BEOL metal element.

20. The BEOL metal element of claim 19, wherein the opposed side shield surfaces are fabricated using minimally spaced square vias.

21. The BEOL metal element of claim 19, wherein the opposed side shield surfaces are fabricated using long bar vias.

22. A three dimensional, dynamically shielded, high Q BEOL (back end of line) metal element, comprising:
a BEOL metal element;
a conductive three dimensional shield element which wraps around the BEOL metal element to substantially reduce or eliminate parasitic capacitive coupling between the BEOL metal element and a conductive substrate, and parasitic shunt capacitance coupling between different adjacent shunt sections of the BEOL metal element, wherein the BEOL metal element comprises a BEOL upper inductor element.

23. The BEOL metal element of claim 22, wherein the three dimensional shield element is dynamically driven to the same electrical potential as the BEOL upper inductor element, to substantially reduce or eliminate the parasitic capacitances of the BEOL upper inductor element.

24. The BEOL metal element of claim 23, wherein the three dimensional shield element includes a lower shield surface having a width greater than the width of the BEOL upper inductor element, and opposed side shield surfaces which extend upwardly from opposite side edges of the lower shield surface and are spaced from opposite sides of the BEOL upper inductor element, such that the three dimensional shield element forms a U shaped shield which wraps around the BEOL upper inductor element.

25. The BEOL metal element of claim 24, wherein the opposed side shield surfaces are fabricated using minimally spaced square vias.

26. The BEOL metal element of claim 24, wherein the opposed side shield surfaces are fabricated using long bar vias.

27. The BEOL metal element of claim 24, wherein the BEOL upper inductor element comprises a two dimensional convoluted conductor element with a series of linear conductor segments separated by angular bends, such that the series of linear conductor segments and angular bends enable the conductor element to convolute within itself and terminate in an inner end near the center of the convoluted conductor element, and the three dimensional shield element is formed below and follows the convoluted shape of the conductor element.

28. A three dimensional, dynamically shielded, high Q BEOL (back end of line) metal interconnect comprising:
a BEOL metal element;
a conductive three dimensional shield element which wraps around the BEOL metal element to substantially reduce or eliminate parasitic capacitive coupling between the BEOL metal element and a conductive substrate, and parasitic shunt capacitance coupling between different adjacent shunt sections of the BEOL metal element, wherein the three dimensional shield element is dynamically driven to the same electrical potential as the BEOL metal element, to substantially reduce or eliminate the parasitic capacitances of the BEOL metal element.

29. The BEOL metal element of claim 28, wherein the three dimensional shield element includes a lower shield surface having a width greater than the width of the BEOL metal element, and opposed side shield surfaces which extend upwardly from opposite side edges of the lower shield surface and are spaced from opposite sides of the BEOL metal element, such that the three dimensional shield element forms a U shaped shield which wraps around the BEOL metal element.

30. The BEOL metal element of claim 29, wherein the opposed side shield surfaces are fabricated using minimally spaced square vias.

31. The BEOL metal element of claim 29, wherein the opposed side shield surfaces are fabricated using long bar vias.

* * * * *